United States Patent [19]

Anderson

[11] 4,456,874
[45] Jun. 26, 1984

[54] ANALYSER FOR ELECTROMOTIVE DEVICE

[76] Inventor: Keith Anderson, 44715 Beech St., Lancaster, Calif. 93534

[21] Appl. No.: 338,337

[22] Filed: Jan. 11, 1982

[51] Int. Cl.³ .......................................... G01R 31/02
[52] U.S. Cl. ................................................. 324/51
[58] Field of Search ................................... 324/51, 52

[56] References Cited

U.S. PATENT DOCUMENTS 2,427,672  9/1947  Haydock ............................... 324/51
2,654,065  9/1953  Foust et al. ........................... 324/51

*Primary Examiner*—Stanley T. Krawczewicz
*Attorney, Agent, or Firm*—Harlan P. Huebner

[57] ABSTRACT

A device for analyzing for electrical faults in electromagnetic devices wherein through cradling of said devices electrical circuitry may be affixed thereto which when activated will give off visual light illuminations, ohm meter readings, fault meter readings and oscilloscope readings to convey "open", "short", or "ground" faults or the lack thereof. The circuitry involved includes a potentiometer, amplification elements for the signal passed to the circuitry and the aforementioned meters and scope.

6 Claims, 3 Drawing Figures

ANALYSER FOR ELECTROMOTIVE DEVICE

BACKGROUND OF THE INVENTION

Automotive starter and generator armatures when assembled are not always in perfect working order and may have what are known as faults which can render them useless unless the trouble is found.

Generally there are three types of faults that can occur in armatures. They are normally identified as "open circuits" which consists of either a broken wire therein or an unsoldered connection at the commutator of an armature. A second fault is identified as "shorts" which can occur within the loops of wire which make up the armature or "shorts" within the commutator. The third fault is identified as "ground leak", which usually occurs between wire loops or commutator segments and the grounded iron laminations or steel of the armature. Finally, it must be recognized that not just one of the single faults identified above may occur, but it may be a combination of two or three of the above.

Heretofore, the only known method of detecting faults in armatures was through an instrument which required hand rotation of an armature which resulted in a laborious determination of faults. Further, the only known analyser was primitive in that to check for shorts, 60 cycles of power were passed through one-half of the coil as it lay in a cradle. A hacksaw blade is then laid on the armature and if there is vibration of the blade the armature is shorted. Also to check for opens two leads are taken from the cradled armature and moved to each contact of the commutator of the armature wherein a volt meter is read to determine whether there is a broken wire or faulty commutator connection.

As can be seen the only known prior art is very cumbersome and not particularly effective.

SUMMARY OF THE INVENTION

An object of the invention is to provide a single unit which is capable of testing for the above three faults to determine if the armature is good or whether it has a fault or faults.

Another object of the invention is to provide apparatus where a number of armatures may be tested very quickly, so that not only are the problems diagnosed but are located as well.

A further object is to provide a device which includes a stand or test fixture, armature rotating means inductive, electronic circuitry, and operator controls and visual readout means.

Another object of the invention is to provide a single test stand for the identification and location of the three faults or combination thereof in armatures.

It is a further object to use a high excitement frequency of the 7000 hz range with moderately high rotation rate in the range of 6.67 hz during testing. Further, the armature speed of rotation is in the range of 400 revolutions per minute.

A further object is to provide visual light means to register whether an armature is good or faulty.

Another object of the invention is to provide a drive arm means to include means to engage the armature and rotate the same whereby the individual tests may be performed to determine whether there are faults or no faults.

Further objects and advantages of the invention may be brought out in the following part of the specification wherein small details have been described for the competence of disclosure, without intending to limit the scope of the invention which is set forth in the appended claims.

BRIEF DESCRIPTION OF THE DRAWINGS

Referring to the accompanying drawings, which are for illustration purposes.

DETAILED DESCRIPTION OF THE PREFERRED EMBODIMENTS

Figure 1:
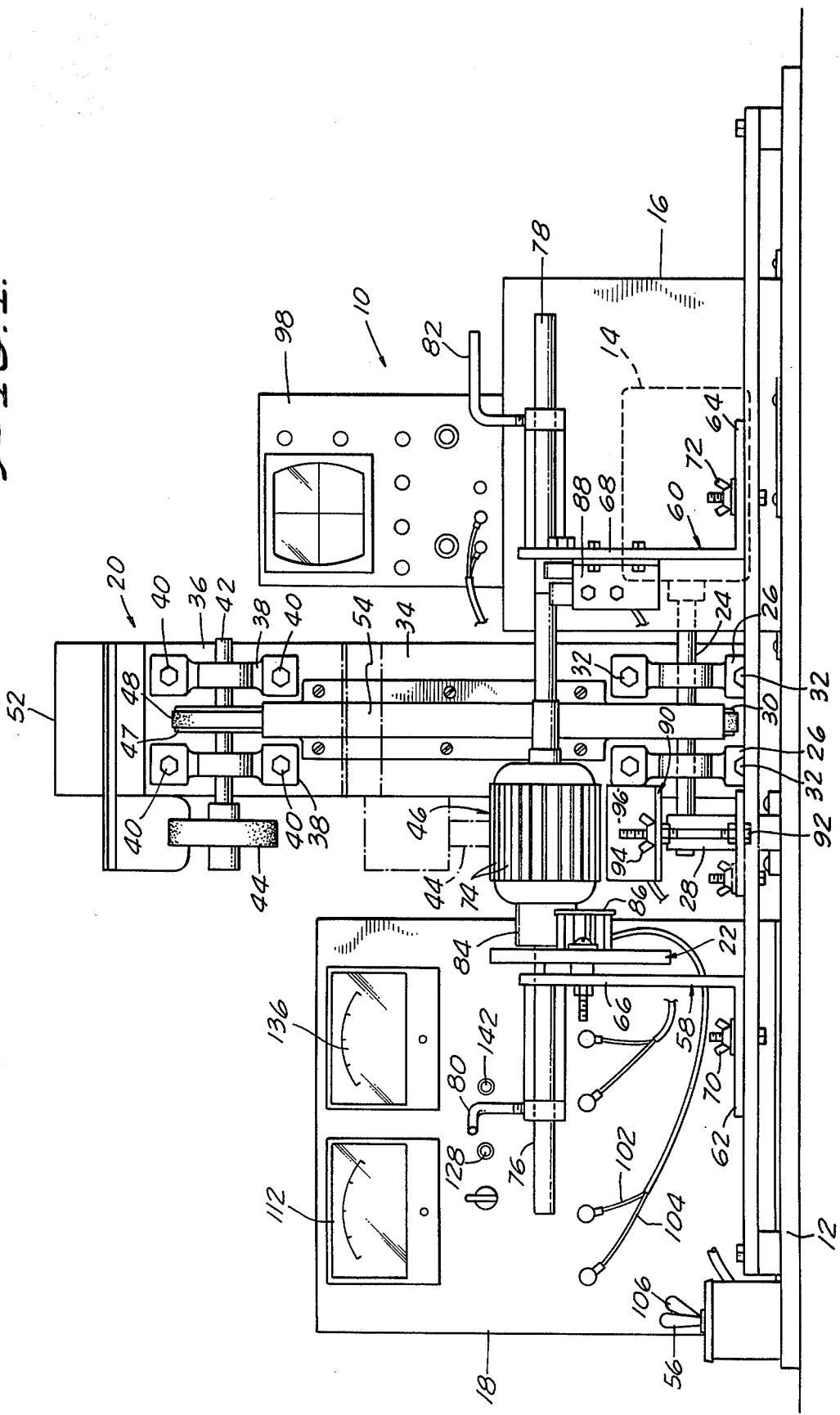
FIG. 1 is a front elevational view of my analyser showing an armature in place for testing.

In FIG. 1 there is illustrated the analyser for an electronic device, generally designated 10. The analyser 10 includes a base 12 upon which is mounted the various elements of the invention. The main parts of the analyser 10 are a motor 14 within a motor housing 16, the control box 18 housing electric circuitry and meters, the armature drive means generally designated 20 and the armature retention means generally designated 22.

The motor 14 is preferably mounted on the base 12 and the housing 16 may be of sheet metal or other material, wherein the sides, top and one end are closed. The end where the motor 14 projects from may be fully or partially open. The size of the opening is immaterial as long as the motor drive shaft 24 can project outward and is journalled in pillow blocks 26. The shaft 24 extends through and terminates in a motor shaft mount 28 which in turn is secured to the base 12.

Splined or otherwise locked on the shaft 24 is a pulley 30. The pillow blocks 26 are secured by bolts 32 to an elongated guard plate 34 at the upper end 36 of the plate 34 a second pair of pillow blocks 38 are mounted to the plate 34 by means of bolts 40 in line with the lower blocks 26. Journalled in the blocks 38 and extending beyond the edge of the plate 34 is a shaft 42 which includes a roller 44 preferably having an exterior rubber surface for engaging an armature 46. As the pulley 30 below, there is a pulley 47 splined or otherwise secured on the shaft 42. Extending around the respective pulleys 30 and 47 is a belt 48, best seen in FIG. 2.

In addition the armature drive means 20 includes at the top 36 a hand guard 52. Also there is provided a belt guard 54 which extends approximately the length of the belt 48.

Figure 2:
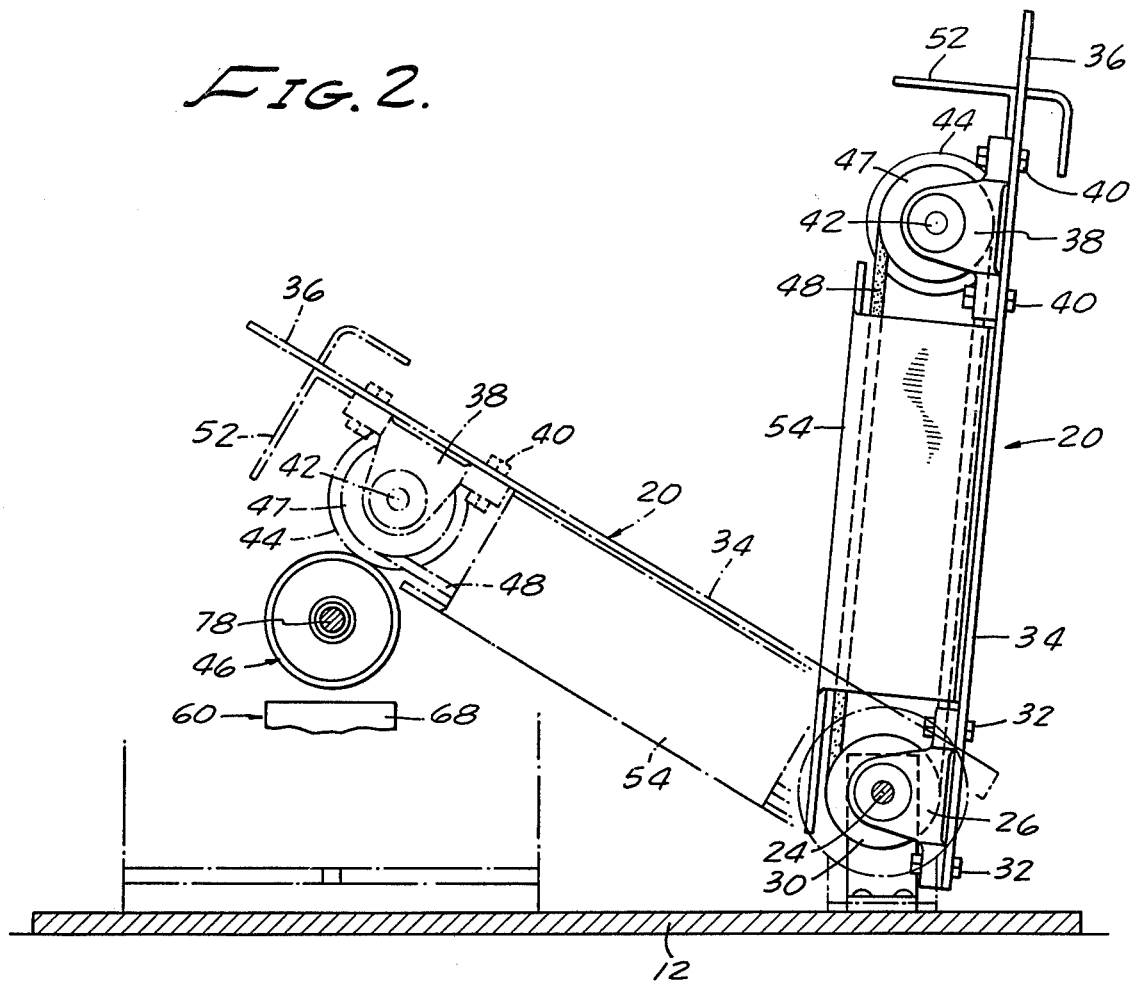
FIG. 2 is a side elevational view of a drive arm in an up or unengaged position and a drive position in phantom lines to rotate an armature being tested.

The entire armature drive means 20 can be pivoted as best seen in FIG. 2 to the upright position and out of contact position are shown in solid lines. In order to move the means 20 to an armature engaging position shown in phantom lines, the upper end of plate 34 is grasped and pulled down, pivoting on the motor drive shaft 24. The switch 56 is turned on and the motor 14 is activated, the belt 48 rotates as does the roller. The roller 44 engages the armature 46 placed in the equipment for testing and rotates the same at approximately 6.6 hz or approximately 400 R.P.M.

Next to be discussed in its detail is the armature retention means 22, as seen in FIG. 1. There are provided an opposed pair of armature support angles 58 and 60 which include base legs 62 and 64 and upright legs 66 and 68. The angles 58 and 60 can be adjustably mounted on the base 12 by means of wing nuts 70 and 72. By such an adjustment the armature may be properly positioned there between so that the roller 44 will engage and turn on the laminations 74 of the armature 46.

On each side of the armature 46 are adjustment shafts 76 and 78 which include locking handles 80 and 82. The adjustment of the shafts 76 and 78 should be such as to engage the armature 46 so that the commutator 84 of the armature 46 rides on brushes 86 without touching the left angle 58. The right shaft 78 is adjusted so that the grounding contact 88 to the housing 18 and bearing ride on smooth surfaces of the shaft 78.

Positioned underneath the armature 46 is an adjustable coil stand 90, which can be adjusted up and down through bolt 92 and wing nut 94. Placed on the stand 90 is an oscillator coil 96 which preferably generates a high frequency 7000 hz electromagnetic field. By moving the coil 90 to a very close proximity to armature laminations 74, a current flow is induced in the windings.

The signal or current flow induced in the windings is picked up by the brushes 86 riding on the commutator 84. The signal or current flow then will pass to the circuitry within the control box 18 and to an oscilloscope 98.

Figure 3:
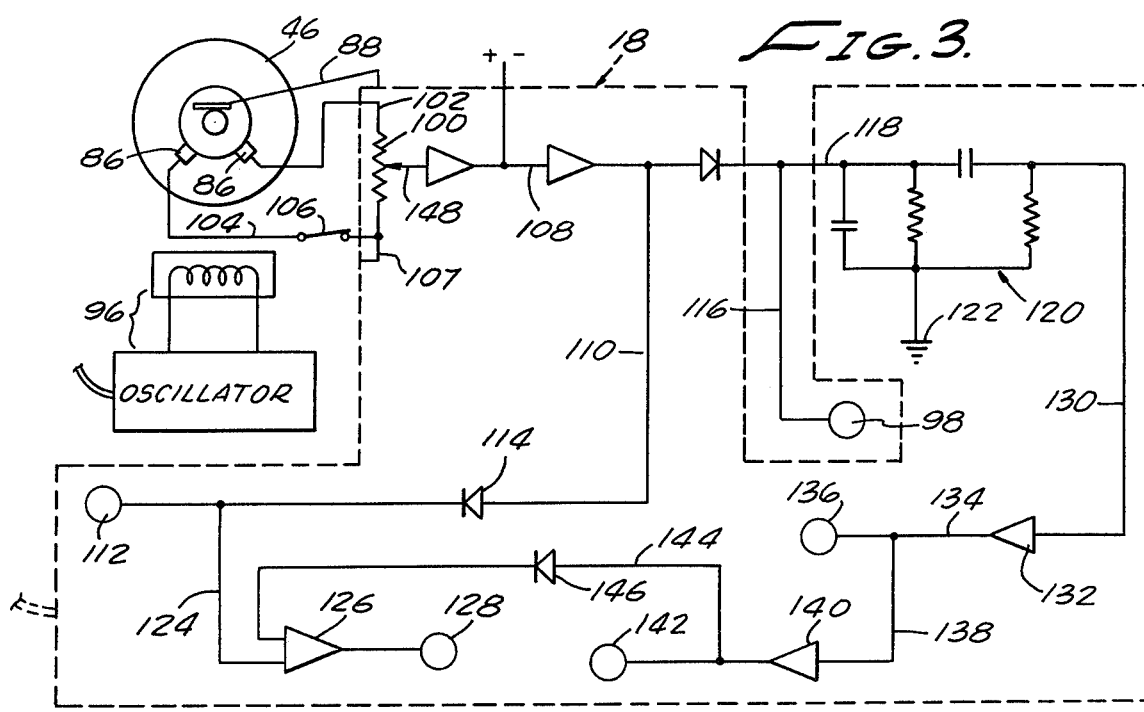
FIG. 3 is a schematic drawing of the inductive circuitry whereby the various tests for armature faults are conducted and registered by lights and meters or an oscilloscope.

Now referring particularly to FIG. 3, a schematic representation of the inductive circuitry mounted within the housing 18, shown in dashed lines in FIG. 3 is presented.

Within the housing 18 is an adjustment potentiometer 100 connected in series through 102 and 104 to the two commutator brushes 86. Mounted in the line 104 is a ground check switch 106 from ground wire 107 running to the housing 18. The potentiometer 100 is used to set the level of signal which is given by the armature. This provides a means of setting the level of signal for a particular armature type so that on a number of the same type being tested, the level is constant. The setting is adjusted for each of various types.

The potentiometer 100 is connected through a two-stage amplifier 108 by line 110 to an ohm level meter 112. A diode 114 is also interposed in line 110. In order to set the gain control, a good armature of the type to be tested is placed in the armature retention means 22 and rotated. The voltage is given off through the brushes 86 to the potentiometer 100 which is turned until the voltage moves to the ohm meter 112 and the needle arrives at a preset set point. The voltage coming out of the two stage amplifier 108 is given a voltage gain of 104±5.

From the two stage amplifier 108 the voltage output goes to three other places than the ohm meter 112. First, through line 116 it will move to a conventional oscilloscope 98. Second, through line 118 it will move to a filter and DC removal circuitry 120 which is grounded at 122. Finally, through line 110 a line 124 leads off to a green light comparator and light driver 126, then to a green light 128 mounted on the control box 18 which is used as a quick visual indicator that the armature is good with regard to the particular fault being tested.

After passage of a signal to the filter and DC removal circuitry 120, it may continue along line 130 through a single fault amplifier 132 which increases the gain by 10±1 and then through line 134 to fault meter 136 mounted on the front box 18. In addition, by line 138 the signal may be carried to a red light comparator and light driver 140 to a red light 142 mounted on the control box 18. The red light 142 is used as a quick indicator that the armature being tested has a fault.

There is also a connecting line 144 which connects the respective light comparators. A diode 146 is interposed in the line 144. The bypass line 144 and diode 146 prevent having the green light 128 on when red light 142 is on.

The fault meter 136 will give a visual indication of a fault in an armature. The reading on the meter 136 is relative. The operator is alerted, by this meter reading, to the fact he must look at the oscilloscope 98 for a fault picture to be described.

In operation, if it is desired to make a test for "ground leak", switch 56 is moved to the "on" position which activates the motor 14 and in turn the roller 44. The armature drive means 20 is pivoted and the roller 44 engages and rotates the armature 46. At the same time switch 106 is opened so that the circuit from brush 86 on wire 104 is opened and this will let the armature shaft 76 furnish the ground path for the signal in the windings. Thus, any current which flows from the shaft ground through the positive brush 86 will represent a leakage path. The signal goes through 102, 110 to the ohm meter 112 where it is read as ohms resistance to ground. Further, if the ground or leakage is an unsymmetrical ground, the picture on the oscilloscope 96 will show a wavy line of strong magnitude and through line 124 and 144 the signal will pass to the red light 142 which will light. In addition, the signal will pass to the fault meter 136 which will read very high. If, on the other hand, the leakage is relatively low, the armature is good, and the ohm meter 112 may read infinite ohms. (Green light 128 does not function on this part of test.)

In other words, when conducting the "ground leak" test, the ohm meter 112 provides an indication of the amplitude of the leakage current flowing in from the armature loops or commutator 84 to the ground armature shaft 76. If no indication is seen on the meter 112, there is no leakage current. If an indication is present, then a ground leak is present and the magnitude of the leak is proportional to the amount of ohm meter deflection. In the ground test mode the meter 112 reads the rms voltage induced by leakage flow through the adjustment potentiometer 100. The measurement represents the potential difference between the grounded armature shaft 76 and brush 86 attached to wire 102 and potentiometer wiper arm 148.

In order to test for "open or shorts circuits", the switch 56 is moved to the "on" position, the roller 44 rotates and the armature drive means 20 is pivoted so the roller 44 engages and rotates the armature 46. The output signal is picked up by the two brushes 86 contacing the commutator 84 of the armature 46.

The signal is transmitted to the potentiometer 100 and is measured from the wiper arm 148 of the potentiometer 100 to the ground brush of the armature 46. If no fault exists, the signal passes into the two-stage amplifier 108 and the rectified output will consist of nearly level DC component with a slight high-frequency ripple on the oscilloscope 98. In this case, the signal will also pass to the green light 128 which will be illuminated.

If on the other hand an "open" condition exists the same signal output will show a different wave on the oscilloscope 98 more like a square wave in appearance. If on the other hand a "short" exists the rectified signal will show upon the oscilloscope 98 in four sharp-peaked cycles in both the "open" or "short" test where a fault is found the signal will pass to the red light 142 which is illuminated.

Once it has been established by the analyser 10 that faults exist in the armature 46 which have been diagnosed as short, ground or open, the next step utilizing the same apparatus is to locate the position of the faults. In order to do that, the armature drive means 20 is pivoted out of contact with the armature 46 which is then turned slowly by hand while observing the ohm meter 112. When the area of lowest reading shows on the meter 112 the armature 46 can be rocked back and forth to obtain a mid-point in the low reading. In order to proceed:

1. To check for location of open:
   With the armature at the mid-point of the low reading, the open will be in an area 90 degrees from the lowest part of the armature on either one of two sides.
2. To check for location of short:
   There will be four positions of low readings. Two opposites will read lower than the other two opposites. When the reading is lowest the short will be in an area 90 degrees from the lowest part of the armature on either of the two sides.
3. To check for location of grounds:
   Same as on opens.

The unique feature of this approach lies in the use of the higher excitation frequency (7000 hz) and in the use of a moderately high rotation rate (6.67 hz) during testing. The procedure concentrates the effects of the faults in armatures 46 in the low frequency portion of the composite signal where they can be easily isolated from both the 7000 hz carrier frequency and from an DC content present at the various stages of detection. This makes possible the use of simple analog logic circuitry to control the various indicator lights and displays, and allows the various types of unique fault waveforms to be readily isolated and identified by means of the oscilloscope display.

The invention and its attendant advantages will be understood from the foregoing description and it will be apparent that various changes may be made in the form, construction and arrangements of the parts of the invention without departing from the spirit and scope thereof or sacrificing its material advantages, the arrangements hereinbefore described being merely by way of example. I do not wish to be restricted to the specific forms shown or uses mentioned except as defined in the accompanying claims, wherein various portions have been separated for clarity of reading and not for emphasis.

I claim:

1. An analyser for testing electromagnetic devices for mechanical faults which may render said device electrically inoperative due to a short therein, open circuit therein, grounding therein or a combination thereof, wherein said analyser includes:
    a base member;
    a motor driven electromagnetic device drive means pivotally secured on said base and adapted to be moved into and out of contact with said electromagnetic device dependent upon the test to be conducted, said drive means including a rotatable contact member adapted to directly engage said device;
    a retention means mounted on said base adapted to receive and maintain therein said electromagnetic device for testing said device includes adjustable stand elements to position said electromagnetic device therebetween in locked position against vertical movement and said device includes bearings to cradle said electromagnetic device for rotation; and
    inductive electrical circuitry connectable to said electromagnetic device and adapted to receive an electrical signal impulse therefrom and convert the same to be visually read to determine whether there is a single fault therein or combination of faults as well as to determine the lack thereof, and a coil and oscillator mounted on said base justaposed with said electromagnetic device and slightly spaced therefrom, which when energized will excite said electromagnetic device by induction.

2. An analyser as defined in claim 1 wherein:
    said electrical circuitry includes a potentiometer to equalize a signal passing from said electromagnetic device, at least one amplifier to increase the amplification of said signal, a filter DC removal element, an ohm meter to visually read and an oscilloscope in said inductive circuitry to provide a pictorial wave representation of the signal passing from the device.

3. An analyser so defined in claim 1 wherein said inductive electrical circuitry is included in a housing mounted on said base; and said circuitry includes:
    an adjustable potentiometer adapted to receive a signal given off by said electromagnetic device, an amplifier to increase the amplitude of said signal, an ohm meter and fault meter mounted in said housing and receiving said signal wherein visual inspection can be undertaken to determine whether a fault exists in said electromagnetic device; and
    leads extending from said inductive circuitry to an oscilloscope outside of said housing whereby pictorial wave representation of said signal may be provided.

4. An analyser as defined in claim 3 wherein said inductive circuitry may also include lights mounted on said housing to preliminarily visually register a signal of either a fault or no fault in said electromagnetic device.

5. An analyser as defined in claim 4 wherein said electromagnetic device is an armature and commutator said motor driven electromagnetic drive means includes:
    a frame having a first and second end;
    a first pulley mounted on said frame adjacent said first end;
    a second pulley mounted on said frame adjacent said second end and aligned with first pulley; an endless belt extending around said pulleys;
    said motor journalled to said first pulley;
    said rotatable contact member connected to said second pulley and including a surface adapted to contact said armature;
    said frame pivotable about said motor from a normal upright position to an armature engaging position whereby when said motor is activated said rotatable contact member will rotate and in turn rotate said armature at approximately 400 R.P.M.

6. An analyser for rapidly testing an armature wherein each armature includes a commutator at one end thereof said analyzer including:
    a base member;
    an armature retaining means mounted on said base member including cradle means to rotatingly retain said armature in a relatively horizontal plain and adjustable clamp means extendable toward each other over said cradle means adapted to engage said commutator and an end of said armature remote from said commutator and lock said armature against vertical movement;

an armature drive means including a motor mounted on said base member with a shaft projecting from said motor, an elongated frame having a first end pivotally mounted on said shaft and a first pulley journalled on said shaft, a second pulley mounted on and adjacent a second end of said frame, an endless belt extending around said pulleys, an armature contact member rotatable by said second pulley, and said frame pivotable from a normal upright position to an armature engaging position to rotate said armature at approximately 400 R.P.M.;

an oscillator coil and oscillator mounted on said base member underneath said armature and spaced therebeneath whereby when said coil and oscillator are energized the rotating armature will be excited by induction and electrical impulses will be given off from said commutator; and circuitry connected through a pair of brushes engaging said commutator to receive the induced electrical signal impulse therefrom and converting the same to be visually read to determine whether there is a single fault in said armature or combination of faults as well as to determine the lack thereof.

* * * * *